(12) United States Patent
El Baraka et al.

(10) Patent No.: US 10,097,068 B2
(45) Date of Patent: Oct. 9, 2018

(54) ELECTRONIC ASSEMBLY FOR A ROTARY ELECTRICAL MACHINE FOR A MOTOR VEHICLE

(71) Applicant: Valeo Equipements Electriques Moteur, Creteil (FR)

(72) Inventors: Khadija El Baraka, Bussy St Georges (FR); Svetislav Jugovic, Juvisy-sur-Orge (FR); Farouk Boudjemai, Marcoussis (FR)

(73) Assignee: Valeo Equipements Electriques Moteur, Creteil (FR)

( * ) Notice: Subject to any disclaimer, the term of this patent is extended or adjusted under 35 U.S.C. 154(b) by 172 days.

(21) Appl. No.: 15/308,854

(22) PCT Filed: Apr. 28, 2015

(86) PCT No.: PCT/FR2015/051143
§ 371 (c)(1),
(2) Date: Nov. 4, 2016

(87) PCT Pub. No.: WO2015/170035
PCT Pub. Date: Nov. 12, 2015

(65) Prior Publication Data
US 2017/0077788 A1      Mar. 16, 2017

(30) Foreign Application Priority Data

May 5, 2014   (FR) ...................................... 14 54039

(51) Int. Cl.
*H02K 11/00*     (2016.01)
*H02K 5/22*      (2006.01)
(Continued)

(52) U.S. Cl.
CPC ............... *H02K 11/33* (2016.01); *H02K 5/22* (2013.01); *H02K 11/048* (2013.01); *H02K 2209/00* (2013.01); *H02K 2213/12* (2013.01)

(58) Field of Classification Search
CPC ..................... H02K 5/22; H02K 5/225; H02K 11/30–11/38
(Continued)

(56) References Cited

U.S. PATENT DOCUMENTS 5,093,592 A * 3/1992 Fisher .................... H02K 11/23
                                                        200/80 R
6,225,716 B1 * 5/2001 Sies ....................... G01D 5/145
                                                        310/68 B
(Continued)

FOREIGN PATENT DOCUMENTS

FR          2967845 A1    5/2012
WO     WO2010037976 A2    4/2010

*Primary Examiner* — Thomas Truong
(74) *Attorney, Agent, or Firm* — Berenato & White, LLC

(57) ABSTRACT

An electronic assembly (10) for an electrical rotating machine. The electronic assembly comprises a plastic overmoulded casing component (100) comprising housings (101) for receiving power modules (200), a power-conducting part overmoulded in the casing component and comprising a plurality of ground and phase traces (103a, 103b. 102), assembly openings (104', 104a, 104) for receiving means (114) for mounting each power module on the casing component, the power modules comprising a conductive support whereon power switches (2020) and signal components (2030) are mounted, the conductive support (2010) comprising a power connector (2011) connected to the power-conducting part of the casing component and at least two phase connectors (2012a, 2012b) connected to the phase traces (103a, 103b) of the casing component, and a lower
(Continued)

ground plane (300) suitable for receiving the casing component and for being mounted on a dissipation unit of the electrical rotating machine.

20 Claims, 7 Drawing Sheets

(51) Int. Cl.
*H02K 11/33* (2016.01)
*H02K 11/04* (2016.01)

(58) Field of Classification Search
USPC .......................................... 310/71, 68 A–68 R
See application file for complete search history.

(56) References Cited

U.S. PATENT DOCUMENTS

| | | | |
|---|---|---|---|
| 7,872,383 B2* | 1/2011 | Dubuc | H02K 11/048 |
| | | | 310/68 R |
| 2014/0009016 A1 | 1/2014 | Seidenbinder et al. | |

* cited by examiner

ELECTRONIC ASSEMBLY FOR A ROTARY ELECTRICAL MACHINE FOR A MOTOR VEHICLE

CROSS-REFERENCE TO RELATED APPLICATIONS AND CLAIM TO PRIORITY

This application is a national state application of International Application No, PCT/FR2015/051143 filed Apr. 28, 2015, which claims priority to French Patent Application No. 1454039 filed May. 5, 2014, the disclosures of which are incorporated herein by reference and to which priority is claimed.

FIELD OF THE INVENTION

The present invention relates to an electronic assembly for a rotary electrical machine for a motor vehicle. The present invention also relates to a rotary electrical machine comprising an electronic assembly of this type.

It has a particular, but non-limiting application in the field of motor vehicle alternator-starters.

BACKGROUND OF THE INVENTION

In a motor vehicle comprising a thermal engine and a rotary electrical machine such as an alternator-starter, a machine of this type comprises in a non-limiting manner:
  a rotor comprising an inductor in which an excitation current is conveyed; and
  a stator comprising a polyphase winding.

The alternator-starter operates in motor mode or in generator mode. It is a so-called reversible machine.

In alternator mode, which is also known as generator mode, the machine makes it possible to transform a movement of rotation of the rotor driven by the thermal engine of the vehicle into an electric current induced in the phases of the stator. In this case, a rectifier bridge which is connected to the phases of the stator makes it possible to rectify the induced sinusoidal current into a direct current in order to supply consumers of the vehicle, as well as a battery.

On the other hand, in motor mode, the electrical machine acts as an electric motor which makes it possible to rotate the thermal engine of the vehicle via the rotor shaft. It makes it possible to transform the electrical energy into mechanical energy. In this case, an inverter makes it possible to transfer a direct current obtained from the battery into an alternating current in order to supply the phases of the stator, so as to make the rotor rotate.

Control components are used to determine the operating mode of the rotary electrical machine (motor mode or generator mode) via control signals.

The power components (inverter and rectifier bridge) are in general distributed in one power module per in bridge arm.

Each power module consists of:
  an over-moulded conductive tracks part of the MIL (Isolated Moulded Leadframe) type contained in a top of the range plastic housing which can withstand high temperatures. A plurality of electronic switches, conventionally MOSFETs, are welded at a high temperature onto the circuit of conductive tracks, with the electronic switches of a module being, designed to form an inverter/rectifier bridge arm for a phase of the rotary electrical machine;
  a substrate of the ceramic type on which there are glued components (known as drivers) which are designed to provide the control of the power switches;
  a rear conductive plate, typically made of aluminium (known as a backplate) which makes it possible to form the earth of the inverter/rectifier bridge;
  a plastic cover of the PPS, PBT or PA type, which makes it possible to ensure the sealing of the power module;
  signal connection pins which are integrated in the housing, and ensure a connection with an interconnection part which permits transit of power signals between the power module and a control module.

Each power module is tested individually, then fitted on a dissipater of the electrical machine by means of a plurality of screws per power module. Then, for each power module, firstly electrical welds are produced for connection to the phases of the electrical machine and to a power interconnector, for connection to a terminal, known as the terminal B+, for connection to the battery of the vehicle, and secondly laser welds are produced for connection of signal pins to a control module. Then, resin or silicon gel is deposited in order to guarantee protection of the laser welds against aggression from the environment, and to ensure the sealing of the module. Then finally, the electrical machine as a whole is tested.

A disadvantage of this prior art consists in the fact that, during the final testing of the electrical machine as a whole, if any one problem is detected, for example on a power module, the electrical machine as a whole must be scrapped, because the elimination of the welds gives rise to deterioration of the electrical machine.

In this context, the objective of the present. invention is to resolve the disadvantage previously described.

SUMMARY OF THE INVENTION

For this purpose, the invention proposes an electronic assembly for a rotary electrical machine for a motor vehicle, the electronic assembly comprising:
  an over-moulded plastic housing part comprising:
    a plurality of receptacles which are each designed to receive a power module;
    a conductive power part which is over-moulded in the over-moulded housing part, and comprises a plurality of phase and ground tracks;
    fitting orifices which are designed to receive the fitting means in order to fit each power module on the over-moulded housing part;
  a plurality of power modules comprising:
    a conductive support on which there are fitted:
      a plurality of electronic power switches;
      signal components;
    the conductive support comprising:
      a power connector which is designed to be connected to the conductive power part of the over-moulded housing part;
      at least two phase connectors which are designed to;be connected to the phase tracks of the over-moulded housing part;
      a lower ground plate which is designed to receive the said over-moulded housing part and to be fitted on a dissipater of the rotary electrical machine,
  Thus, by means of the over-moulded plastic housing part of the electronic assembly, and by means of the mechanical fitting means (the orifices in particular) of the over-moulded housing part associated with each module, when the electrical machine is not operating for example because of a power module, it is sufficient to dismantle this power module from the over-moulded housing part, in order to scrap it, replace it with a new power module, and test once again the electronic assembly then the electrical machine as a whole. it is no longer necessary to scrap the entire electrical machine.

According to non-limiting embodiments, the electronic assembly can additionally comprise one or more additional characteristics from amongst the following:

the plastic material of the over-moulded housing part is PPS or PBT;

the conductive power part of the over-moulded housing part comprises a plurality of power connection tongues arranged parallel to the plane of the over-moulded housing part, with a power connection tongue being designed to cooperate with a power module;

the phase tracks of the over-moulded housing part each comprise a first phase connection tongue which is designed to connect a power module, with a first phase connection tongue being positioned parallel to the plane of the over-moulded housing part;

the phase tracks of the over-moulded housing part each comprise a second phase connection tongue which is designed to connect a phase of the stator, a first tongue being positioned vertically relative to the plane of the over-moulded housing part;

the over-moulded housing part comprises first and second fitting orifices, and the lower ground plate comprises third and fourth fitting orifices, the fitting orifices being designed to fit the electronic assembly on a dissipater of the rotary electrical machine;

the conductive support of a power module is a printed circuit board (PCB);

the power and phase connectors of a power module comprise respective fitting orifices which are designed to be positioned opposite fitting orifices in the over-moulded housing part, and to receive the fitting means;

the power and phase connectors of a power module are positioned parallel to the plane of the conductive support.

A rotary electrical machine is also proposed, comprising:
a rotor;
a stator which is coupled to the rotor, and comprises a plurality of phases;
an electronic assembly as described briefly above, the over-moulded plastic housing part of the electronic assembly being designed to be connected to the phases of the stator;
a rear bearing which supports the stator; and
a dissipater situated in the vicinity of the rear bearing, which is designed to receive the lower ground plate of the electronic assembly.

According, to a non-limiting embodiment, the rotary electrical machine is an alternator-starter.

BRIEF DESCRIPTION OF THE DRAWINGS

The invention and its different applications will be better understood by reading the following description, and examining the accompanying figures.

DETAILED DESCRIPTION OF THE PREFERRED EMBODIMENT(S)

Elements with structures or functions which are identical, shown in the different figures, retain the same references unless otherwise indicated.

The electronic assembly 10 for a rotary electrical machine is described with FIGS. 1 to 10.

In a non-limiting example, the rotary electrical machine is an alternator-starter. In this type of application, the rotary electrical machine is used for electrical generation and starting of the thermal engine (with the so-called stop & go or stop/start functionality).

Figure 1:
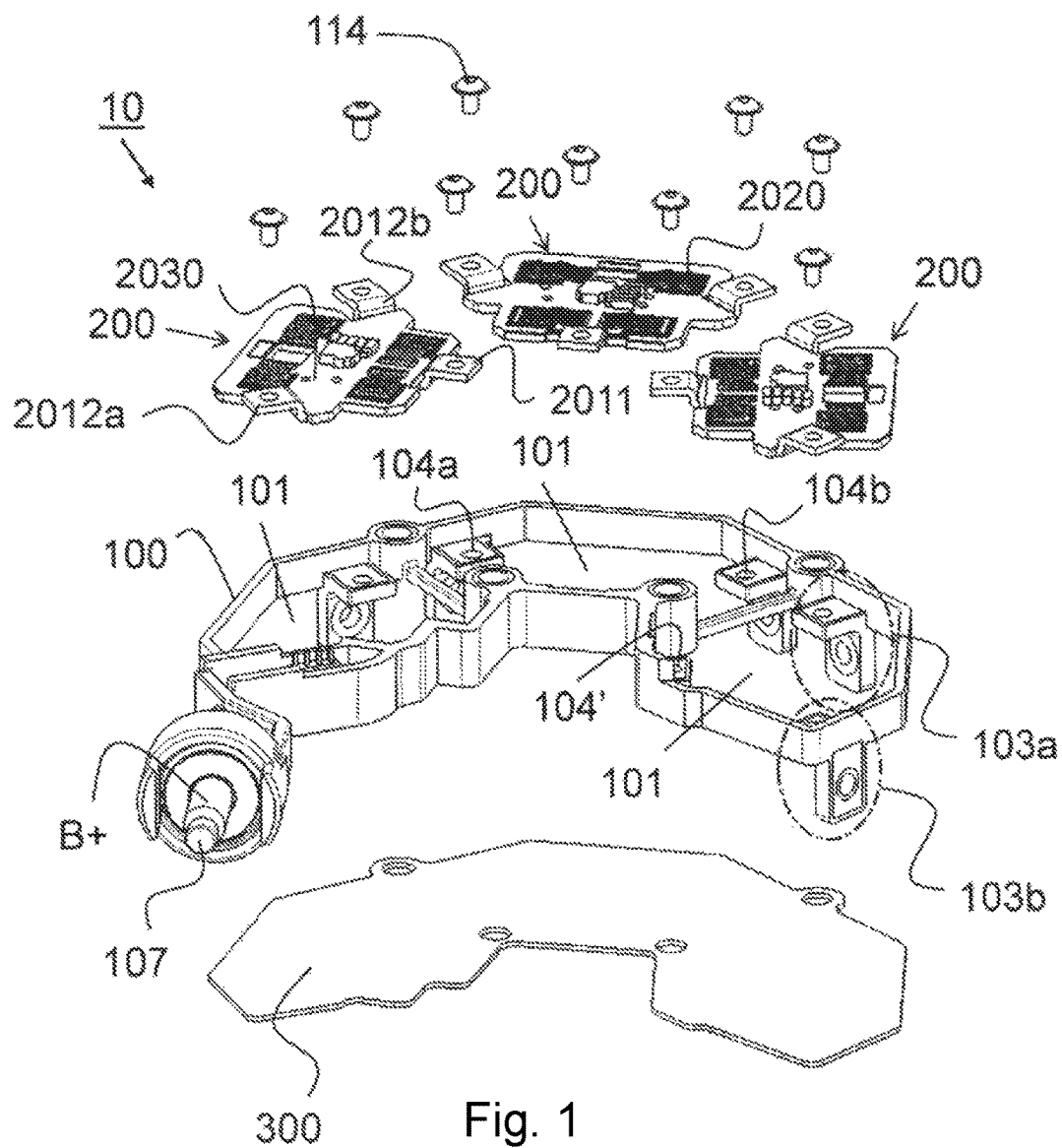
FIG. 1 represents an exploded view in perspective of a non-limiting, embodiment of an electronic assembly for a rotary electrical machine for a motor vehicle, the said electronic assembly comprising an over-moulded plastic housing part according to the invention.

According to a non-limiting embodiment, as illustrated in FIG. 1, the electronic assembly 10 comprises:

an over-moulded plastic housing part 100 (known as a housing);

a plurality of power modules 200;

a lower ground plate 300 (known as a backplate), which is designed to receive the said over-moulded housing part 100, and to be fitted on a dissipater 11 of the rotary elecnical machine, and is destined to be connected to the negative potential terminal of the vehicle battery.

The different elements of the electronic assembly 10 are described in greater detail hereinafter.

Over-Moulded Housing Part

Figure 2:
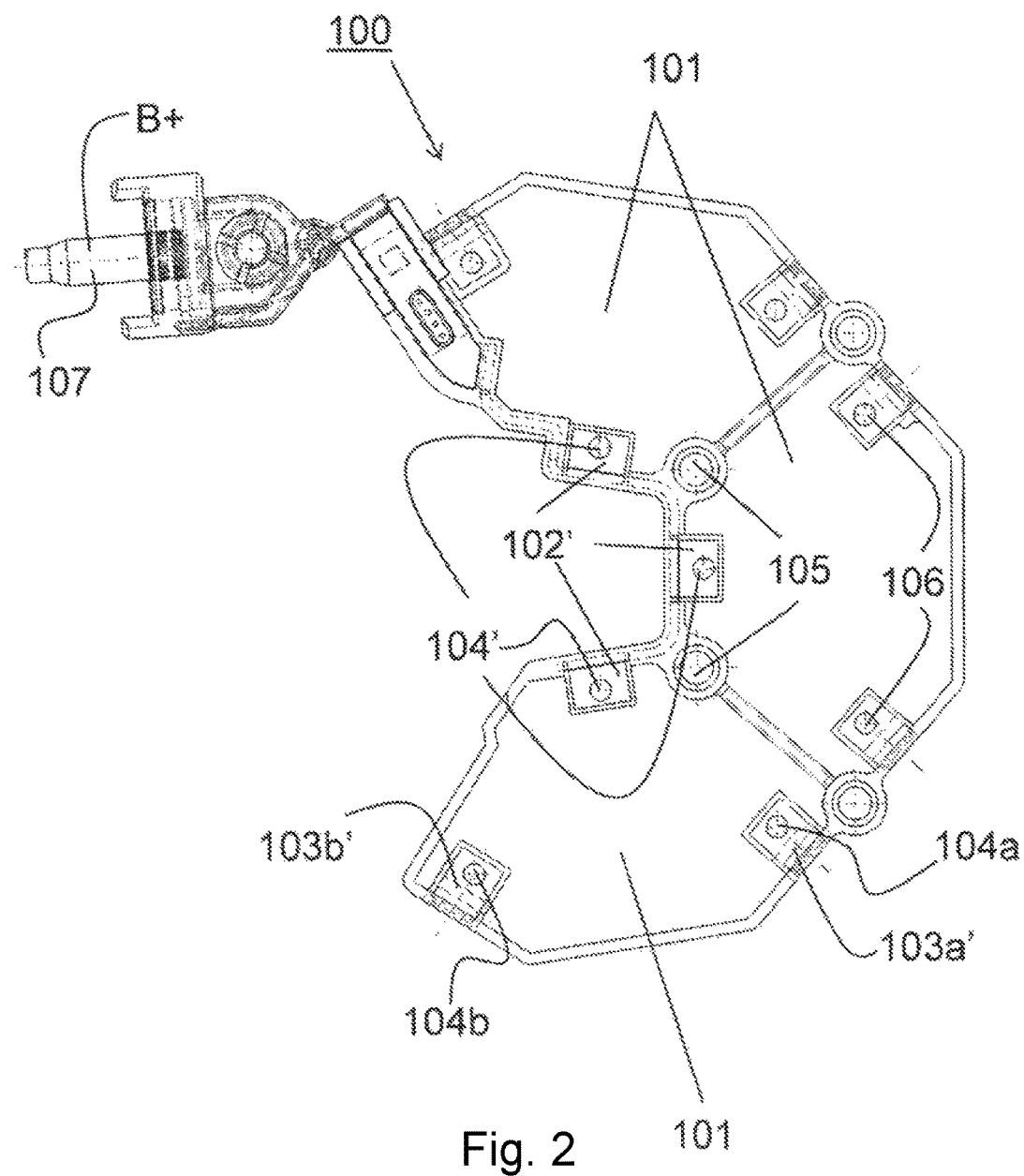
FIG. 2 represents a view from above of the over-moulded housing part of the electronic power assembly in FIG. 1.
Figure 3:
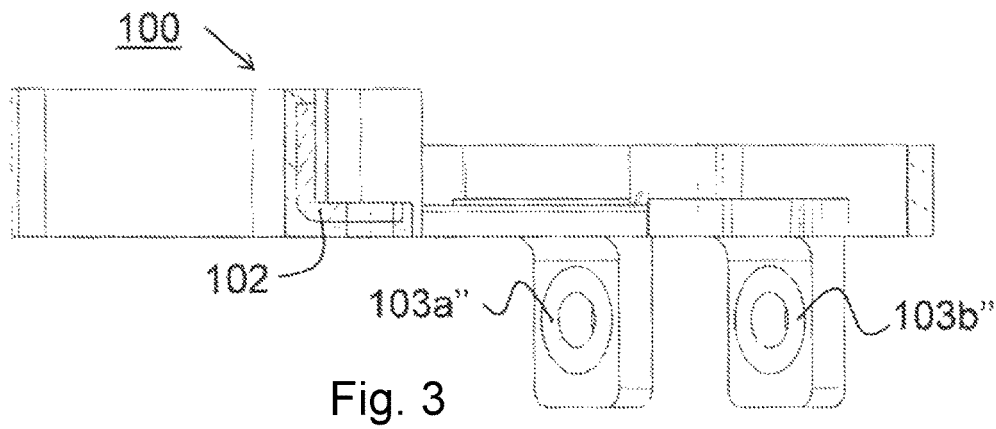
FIG. 3 represents a view in axial cross-section of the over-moulded housing part in FIG. 2.
Figure 4:
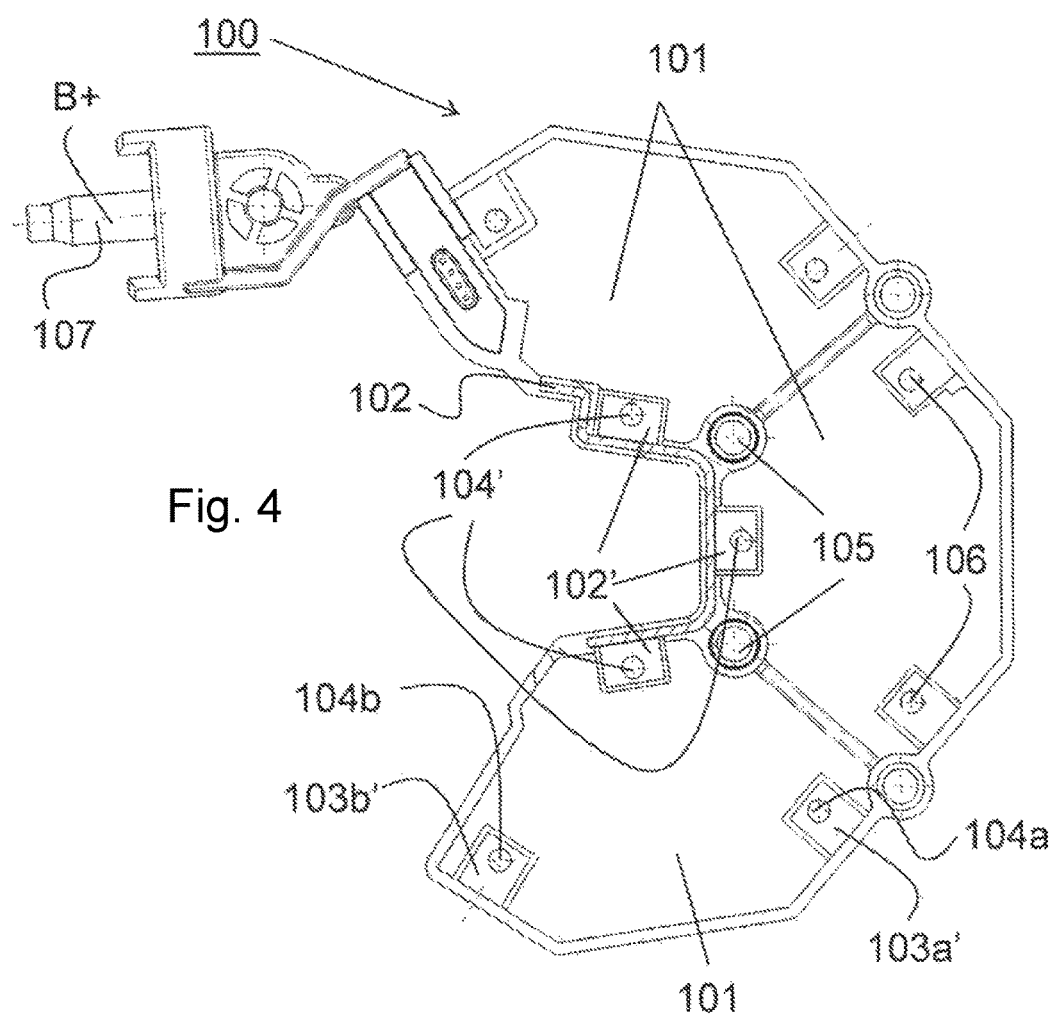
FIG. 4 represents a view in radial cross-section of the over-moulded housing part in FIG. 3.

The over-moulded housing part 100 is illustrated in FIGS. 2 to 4.

In particular, its function is the mechanical protection of the power modules 200 and the mechanical holding of the assembly of the power modules on the rotary electrical machine. In addition, it makes it possible to receive the interconnection with the control module.

The over-moulded housing part 100 is made of plastic material, According to a non-limiting embodiment, the plastic material is PPS (polypropylene sulphide), PBT (polybutadiene terephthalate) or PPA (polyphthalamide).

These types of plastic are inexpensive plastics, the temperature resistance of which is approximately 120° C. to 250° C. In fact, it is not necessary to use a top of the range plastic which withstands high temperatures, since there is no electrical welding or laser welding of the power modules 200 carried out on the over-moulded housing part.

The over-moulded housing part 100 comprises:
a plurality of receptacles 101;

a plurality of conductive power tracks comprising phase tracks 103a, 103b and a track B+102 (which is connected to the power terminal 107); and fitting orifices 104', 104a, 104b, As illustrated in FIG. 2, the receptacles 101 are each designed to receive a power module 200. In the non-limiting example illustrated, there are three receptacles 101 which make it possible to fit three power modules 200 in the over-moulded housing part 100.

The conductive power part 102, which is also known as a power track, or power bus, permits the passage of current into the components of the power modules 200. It is over-moulded in the said over-moulded housing part 100, as illustrated in the figures in cross-section 3 and 4. It comprises a plurality of over-moulded outer power connection tongues 102', a power connection tongue 102' being associated with a power module 200. Thus, a power connection tongue 102' opens into each receptacle 101, and is designed to cooperate with a power connector (described hereinafter) of a power module 200. The tongues 102' are positioned in parallel relative to the (horizontal) plane of the over-moulded housing part 100; this makes it possible to reduce the vertical size of the electronic assembly 10.

The phase tracks 103a, 103b, as illustrated in FIG. 1, are over-moulded in the said over-moulded housing part 100. Two phase tracks 103a, 103b are associated with a power module 200. They make it possible to connect each power module 200 to the phases of the stator. In the particular embodiment described here, two phase tracks 103a, I 03b are arranged in each receptacle 101, at right-angles relative to the plane of the said over-moulded housing part 100. The fact of over-moulding the phase tracks 103a, 103b provides modularity concerning the position of the phase outputs of the stator. It is easily possible to choose to over-mould the tracks in one location of the over-moulded housing part or another, according to the requirements of the electrical machine manufacturers for example, and the number of phases of the machine.

The phase tracks 103a, 103b each comprise respectively:
a first over-moulded phase connection tongue 103a', 103b' which is designed to connect a power module 200. Two first phase connection tongues 103a', 103b' are designed to cooperate with phase connectors (described hereinafter) of a power module 200. As illustrated in FIG. 2 or 4, the first tongues 103a', 103b' are positioned parallel to the plane of the over-moulded housing part 100; this makes it possible to reduce the vertical size of the electronic assembly 10.
a second over-moulded phase connection tongue 103a", 103b" which is designed to connect a phase of the stator. Two first phase connection tongues 103a", 103b" are designed to cooperate with phases of the stator. As illustrated in FIG. 3, the first tongues 103a", 103b" are positioned vertically relative to the (horizontal) plane of the over-moulded housing part 100; this makes it possible to access the said tongues easily for connection with the phases of the stator.

The fining orifices 104', 104a and 104b which are illustrated, in FIGS. 2 and 4 are designed to receive fitting means 114 in order to fit each power module 200 onto the said over-moulded housing part 100.

Again in this particular embodiment of a machine comprising six phases, each receptacle 101 comprises three fitting orifices 104', 104a and 104b, an orifice 104' being integrated in the power tongue 102', and an orifice 104a and 104b being integrated respectively in each phase tongue 103a', 103b'.

As illustrated in FIG. 4, the over-moulded housing part 100 additionally comprises:
first fitting orifices 105, which are designed to fit the over-moulded housing part 100 on a dissipater 11 of the rear bearing of the rotary electrical machine. These two orifices 105 are placed on the inner circumference of the said over-moulded housing part 100; and
second fitting orifices 106, which are designed to fit the over-moulded housing part 100 on the dissipater 11 of the rear bearing of the rotary electrical machine. These two orifices 106 are placed on the outer circumference of the said over-moulded housing part 100.

It will be noted that the inner circumference of the over-moulded housing part 100 is on the periphery of a location 106 which is designed to receive the rotor shaft The first and second fitting orifices are designed to receive fitting means such as securing screws (not represented) in a non-limiting example.

Thus, these fitting means 105-106 of the over-moulded housing part make it possible to fit the assembly of the power modules 200 on the dissipater of the rotary electrical machine. There are no longer fitting means associated with each power module. This therefore reduces the number of fitting means, which makes it possible to optimise the volume occupied by the electronic assembly 10, These screw fitting means 105-106 make it possible to fit the over-moulded housing part 10 of the rotary electrical machine and dismantle it easily without risk, of deterioration.

It will be noted that the over-moulded housing part 100 additionally comprises a signal bus (not illustrated) which is connected in a conventional manner, in a non-limiting example by wire bonding, to the signal components of the power modules. The power modules are described hereinafter.

Power Module

Figure 5:
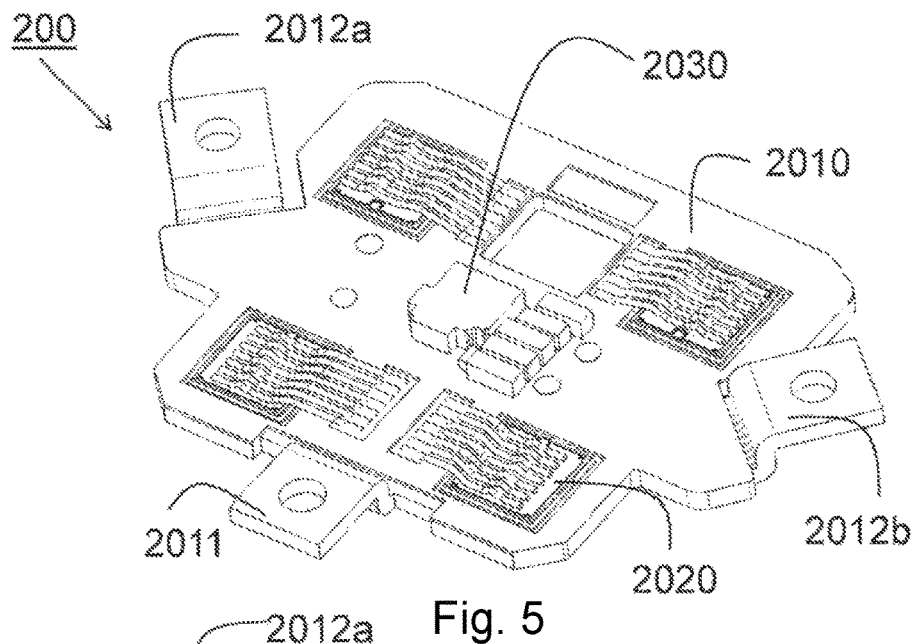
FIG. 5 represents a view in perspective of a non-limiting embodiment of a power module of the electronic assembly in FIG. 1.
Figure 6:
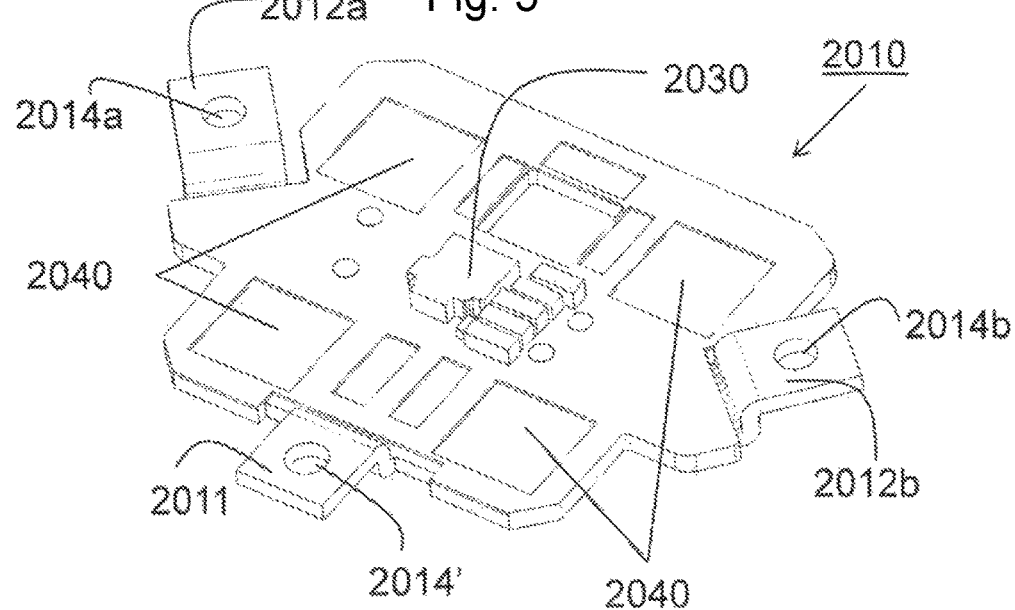
FIG. 6 represents a view in perspective of a conductive support of the power module in FIG. 5.

A power module 200 is illustrated in FIGS. 5 and 6, in non-limiting embodiments.

As illustrated in FIG. 5, a power module 200 comprises:
a conductive substrate 2010 which incorporates three power tracks, i.e. a track B+, a phase track and a ground track;
a plurality of electronic power switches 2020 fitted on apparent power tracks; and
a control circuit incorporating signal components 2030 which are integrated in the substrate.

The electronic power switches 2020 and the signal components 2030 are fitted on the conductive substrate 2010.

In a non-limiting example, the electronic switches are MOSFET transistors, the switches of a module being designed to provide at least one inverter/rectifier bridge arm for a phase of the rotary electrical machine. In the two examples illustrated, the power module 200 comprises two MOSFETs for a bridge arm. The electronic assembly 10 can thus easily be adapted for a three-phase machine or a hexaphase machine. In the case of a three-phase machine, it is sufficient to connect only one phase connector (described hereafter) to a phase of the stator via a phase track 103a or 103b of the over-moulded housing part 100, whereas in the case of a hexaphase machine, it is sufficient to connect the two phase connectors (described hereinafter) to two phases of the stator via two phase tracks 103a and 103b of the over-moulded housing part 100.

As illustrated in FIG. 6, the conductive support 2010 comprises:

a power connector 2011 which is designed to be connected to the conductive power part 102 of the said over-moulded housing part 100, via one of its power tongues 102';

at least two phase connectors 2012a and 2012b, which are designed to be connected respectively to the phase tracks 103a and 103b of the said over-moulded housing part 100, via the first two corresponding tongues 103a' and 103b'.

The power 2011 and phase 2012a, 2012b connectors incorporate respective fitting orifices 2014', 2014a, 2014b, corresponding to the fitting orifices 104', 104a, 104b of the over-moulded housing part 100, i.e. the orifices 2014', 2014a, 2014b are designed to be positioned respectively opposite fitting orifices 104', 104a, 104b In the example illustrated, a power module 100 comprises three fitting orifices 2014', 2014a, 2014b. They make it possible to receive the fitting means 114, which in one non-limiting example are securing screws.

It will be noted that the securing screws 114 make it possible not only to provide the mechanical resistance of the power modules in the over-moulded housing part 100, but also to provide together with the connectors 2011 and 2012a and 2012b respectively an electrical connection between the power modules 200 and the conductive power part 102, and an electrical connection between the power modules 200 and the phase tracks 103a, 103b.

The power 2011 and phase 2012a and 2012b connectors are positioned parallel to the plane of the conductive support 2010, which makes it possible to reduce the vertical size of the electronic assembly 10.

A power module 200 can thus easily be fitted on, and dismantled from, the over-moulded housing part 100 via the securing screws 114 which are inserted in the fitting orifices 2014', 2014a, 2014b and 104', 104a, 104b. It is thus possible to dismantle one or a plurality of defective power modules without damaging the remainder of the electronic assembly 10 or the rotary electrical machine.

It will also be noted that the phase welds present in the prior art have been replaced by mechanical means which fulfil an electrical connection function. Elimination of these phase welds reduces the vertical size of the electronic assembly, since it is no longer necessary to have specific access to the said phases in order to carry out a welding operation.

According to a non-limiting embodiment illustrated in FIGS. 5 and 6, the conductive power support 2010 of the power module 200 is constituted by three conductive power tracks which are separated by an insulating (epoxy) layer and accommodate a PCB (Printed Circuit Board) for the components 2030 (driver) for the control of the electronic, switches 2020. The electronic power switches 2020 are welded directly onto the apparent parts of the power tracks 2040.

Thus, in this embodiment, the plurality of housings (present in the prior art) of the plastic power modules are replaced, thus making it possible to have very high temperatures, using a single housing, i.e. the over-moulded plastic housing part 100 which makes it possible to have lower temperatures, in which single housing there are fitted the power modules without electrical and laser welds, the fitting on the dissipater of the electrical machine being carried out via mechanical fitting means which are common to all the modules.

Lower ground plate

The lower ground plate 300 supports the over-moulded housing part 100, According to a non-limiting embodiment, the plate is made of aluminium, d comprises an electrically insulating part (anodisation for example), in order to ensure good insulation relative to the conductive power tracks (leadframe) with potential B+ and the phase tracks, and a conductive part in order to form the ground connection of the power modules via a brazed wire (wire bonding) connection with the electronic power switches (MOSFET).

Figure 7:
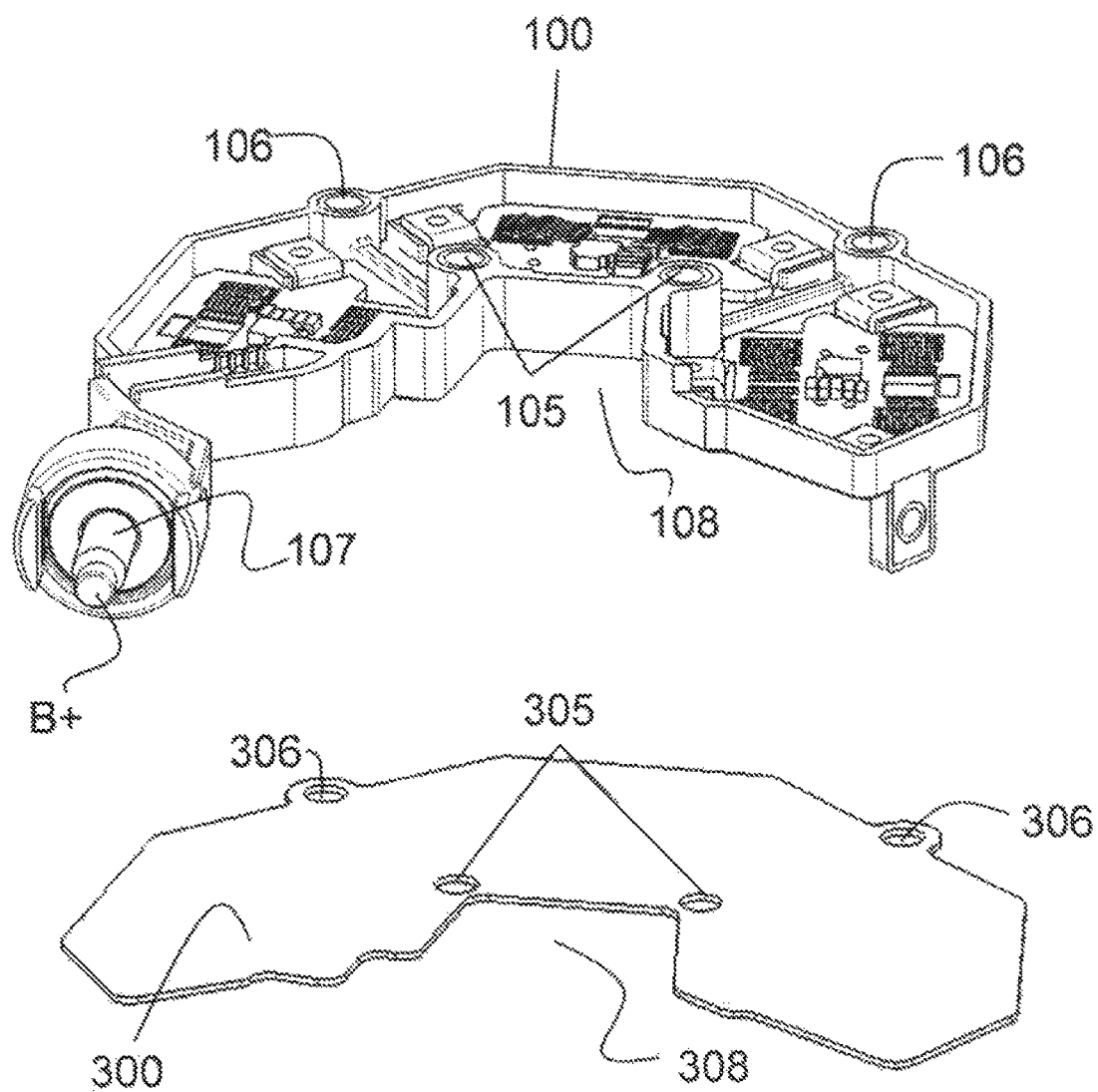
FIG. 7 represents an exploded view in perspective of the over-moulded plastic housing using part and a lower ground plate of the electronic power assembly in FIG. 1.

As illustrated in FIG. 7, the plate 300 comprises:

third fitting orifices 305, which are designed to be coupled to the corresponding first fitting orifices 105 of the over-moulded housing part 100. According to a non-limiting example, it comprises two orifices 305 which are placed on the inner circumference of the said plate 300;

fourth fitting orifices 306, which are designed to be coupled to the corresponding second fitting orifices 106 of the over-moulded housing part 100. According to a non-limiting example, it comprises two orifices 306, which are placed on the outer circumference of the said plate 300.

It will he noted that the inner circumference of the plate 300 is at the periphery of a location 308 which is designed to receive the rotor shaft.

The third and fourth fitting orifices 305 and 306, together with fitting screws (not illustrated) make it possible to fit the over-moulded housing part 100 on the lower ground plate 300 and on the dissipater 11 of the rear bearing of the rotary electrical machine. Thus, the assembly of the fitting orifices 105-106 and 305-306 is designed to fit the electronic assembly 10 on the dissipater 11.

Figure 8:
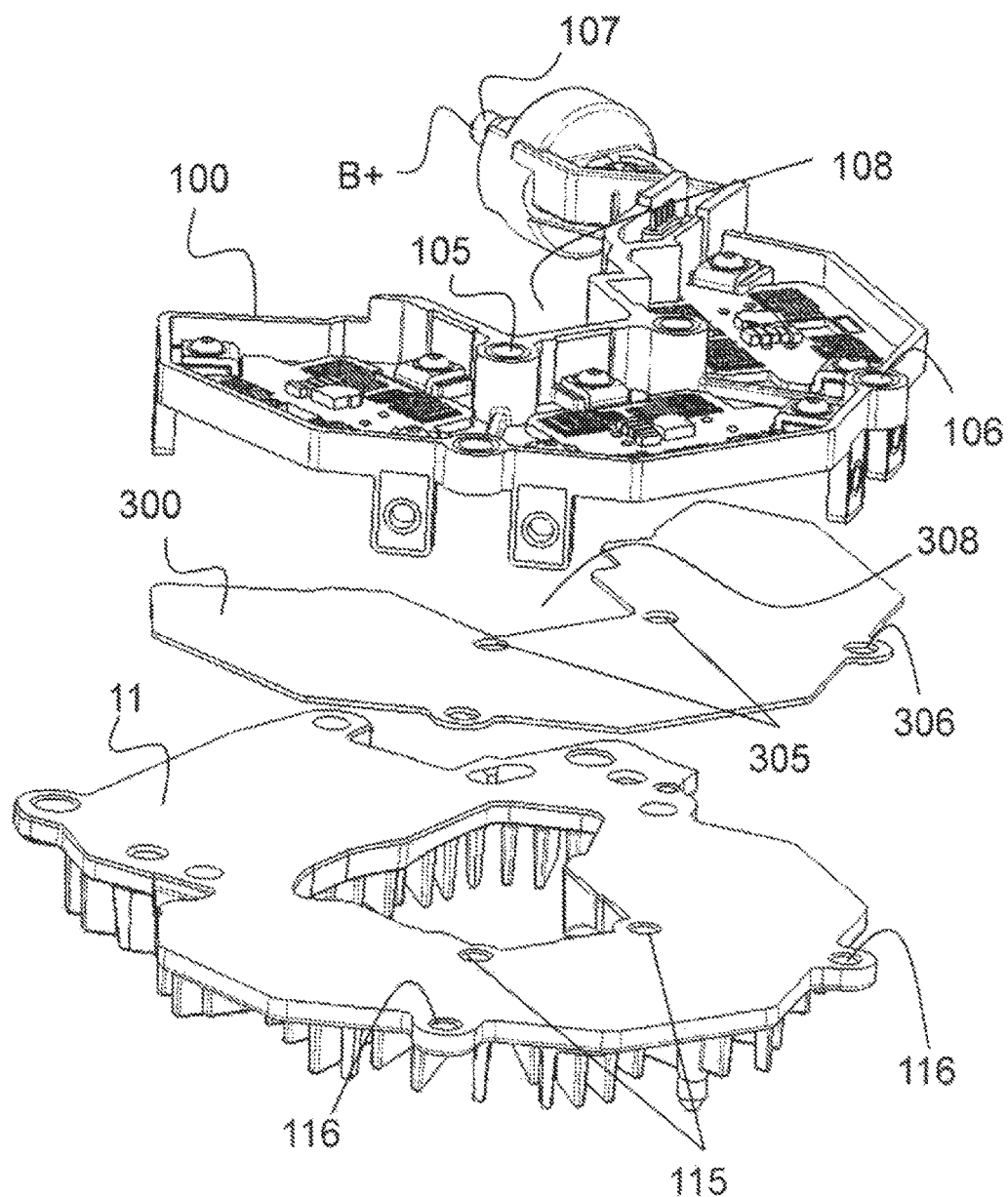
FIG. 8 represents an exploded view in perspective of the electronic assembly FIG. 1 on a dissipater of the rotary electrical machine.

As illustrated in FIG. 8. the plate 300 is fitted directly on the dissipater 11. It is thus connected electrically to the general ground potential of the vehicle.

It will be remembered that, in the non-limiting embodiment in which the rotary electrical machine is a machine of the alternator-starter type, which operates with direct voltage suitable for a vehicle with an electrical network of 48 V (or any other voltage) for example, voltage potentials B+and B−are present in the machine, and correspond respectively to the +48 V and to the 0 V of the 48 V. It will be noted here that theB−(0 V) and the general ground potential of the vehicle are connected electrically in the rotary electrical machine.

The potential B+ is connected to the electrical circuit of the vehicle by means of an insulated electrical terminal 107 of the B−. As illustrated in FIG. 2 or 4, the conductive power part 102 is connected to the electrical terminal 107. The conductive part 102 of the over-moulded housing part 100 is thus connected to the potential B+. The power modules are thus connected to the potential B+ via the conductive power part 102 (the power connectors 2011 previously described being connected to the part 102 via the tongues 102').

The potential B− is conventionally connected to the negative electrical terminal of the battery/batteries of the vehicle, whereas the general earth of the vehicle is connected to its chassis, on which the rear hearing 11 of the electrical machine is fitted. The lower ground plate 300 is thus connected directly to the earth of the vehicle, since it is fitted on the dissipater 11 of the rear bearing of the said machine. The plate 300 thus makes it possible to earth the conductive support 2010 of the power modules 200 when the latter are fitted in receptacles 101 in the over-moulded housing part 100, each support 2010 then being in contact with the plate 300.

The assembly of the different elements of the electronic assembly 10 is carried out as follows:

each power module 200 is fitted in the receptacle 101 provided for this purpose in the over-moulded housing part 100 by the three securing screws 114 inserted in the orifices 2014', 2014a, 2014b and 104', 104a, 104b;

the over-moulded housing part 100 is fitted on the lower ground plate 300;

the over-moulded housing part 100 ground plate 300 assembly is fitted on the dissipater 11 of the rear bearing of the rotary electrical machine by means of the securing screws fitting orifices 305-306 and 105-106 assembly.

It will be appreciated that the sequence of the above-described steps can be different. Thus, it is possible to fit the modules 200 in the over-moulded housing part 100 after having fitted the over-moulded housing part 100 ground plate 300 assembly on the dissipater.

FIG. 8 illustrates in exploded view the assembly of the electronic assembly 10 on the dissipater 11 of the rear bearing of the rotary electrical machine. The dissipater 11 comprises first fitting orifices 115 which are opposite third orifices 305 and first orifices 105 respectively of the lower ground plate 300 and the over-moulded housing part 100, and second fitting orifices 116, which are opposite fourth orifices 306 and second orifices 106 respectively of the lower ground plate 300 and the over-moulded housing part 100.

Figure 9:
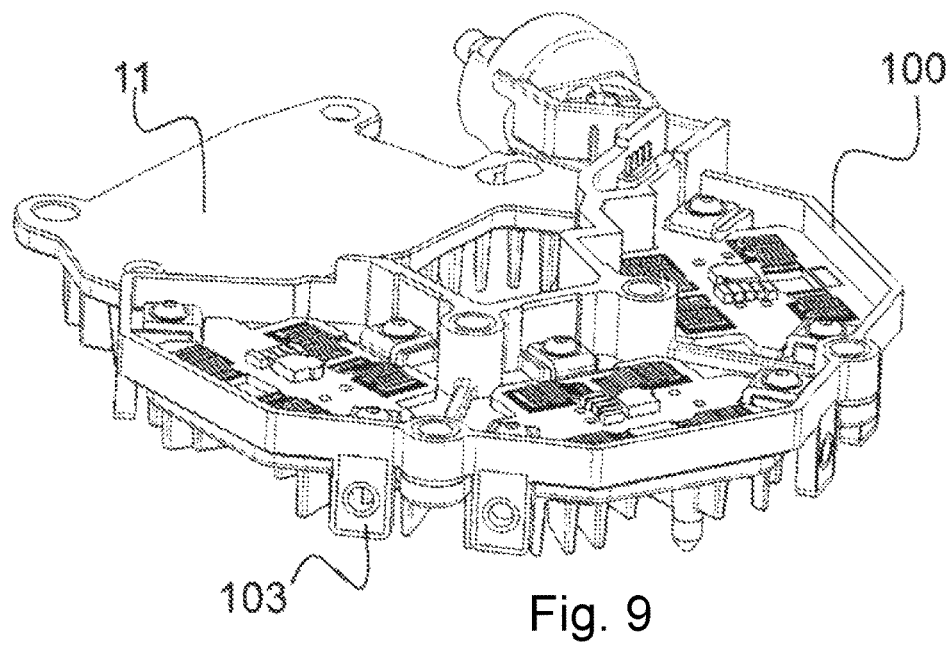
FIG. 9 represents a view in perspective of the electronic assembly in FIG. 8 assembled on the dissipater of the rotary electrical machine.
Figure 10:
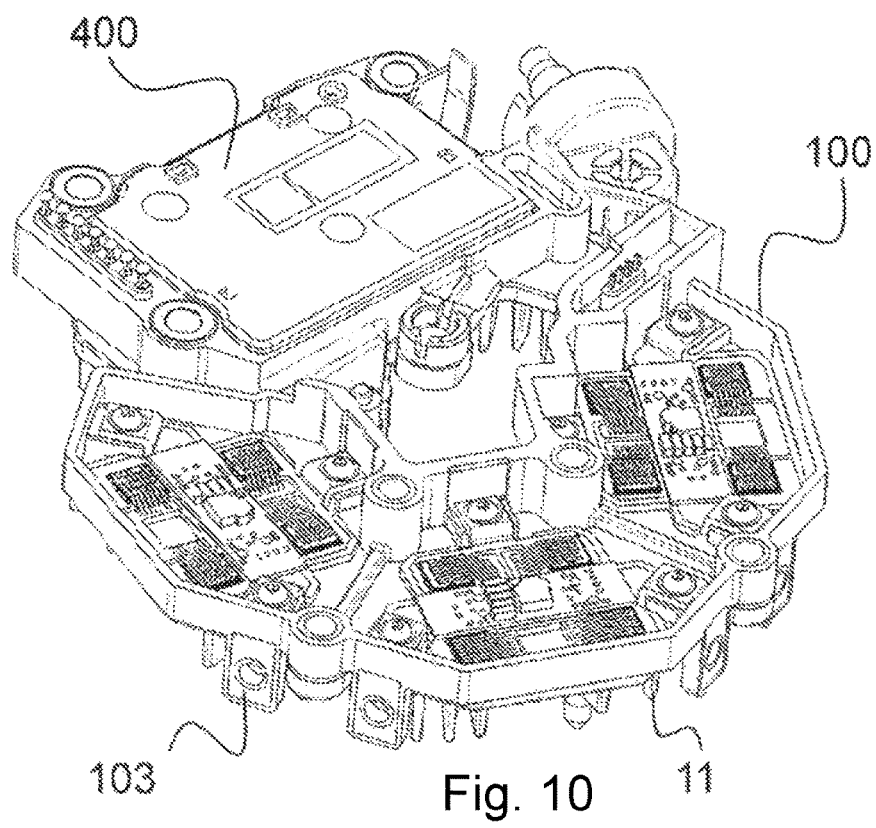
FIG. 10 represents a view in perspective of the electronic power assembly in FIG. 8 assembled on the dissipater of the rotary electrical machine, comprising a control module.

FIGS. 9 and 10 show the electronic assembly 10 assembled on the dissipater 11 of the rear bearing of the rotary electrical machine.

FIG. 10 also illustrates, in a non-limiting embodiment, an additional element 400 which comprises a control module. The control module comprises components in order to control the rotary electrical machine, and in particular the regulation of the machine, by controlling the power modules via the signal bus. Since the control components are known to persons skilled in the art, they are not described in detail hereinafter in the description. It will be appreciated that other embodiments can be created, in which for example the control module is arranged above the over-moulded housing part on a plane parallel to the said over-moulded housing part.

Thus, the electronic assembly 10 described makes it possible to make the alternator-starter function. The latter comprises:
a rotor:
a stator which is coupled to the said rotor, and comprises a plurality of phases;
an electronic assembly 10 according to any one of the preceding characteristics, the over-moulded plastic housing part 100 of the said electronic assembly 10 being designed to be connected to the phases of the said stator;
a rear bearing which supports the said stator; and
a dissipater on which the electronic assembly 10 is supported.

It will be appreciated that the description of the invention is not limited to the application, the embodiments, and the examples described above.

Thus, the present invention applies to any type of reversible polyphase rotary electrical machines, such as alternator-starters, which are driven for example by a belt or are integrated, and in particular for hybrid applications.

Thus, in a non-limiting embodiment, the electronic assembly 10 can comprise as many power modules as necessary (two phases per module at the most), in order to produce a machine with three, five, six or seven phases.

Thus, according to another non-limiting embodiment, the power module 200 can comprise a ceramic unit comprising components for control (driver) of the electronic switches and the signal components. The electronic switches are added onto the conductive support by brazing and wired connection (wire bonding). In this case, the power module additionally comprises a plastic contour which permits mechanical holding of the assembly of the power module elements to one another, in non-limiting embodiments, the plastic material of the contour is PEEK (poly ether ether acetone) or PPA (polyphthalamide). These plastics are very high-performance top of the range plastics which can be used at high temperatures, for example of approximately 350° C., which is advantageous during the brazing of the electronic switches onto the conductive support.

Thus, with this embodiment, a single housing is used, ix. the over-moulded housing part 100, in which the power modules without electrical and laser welds are fitted, the fitting on the dissipater of the electrical machine being carried out via mechanical fining means which are common to all the modules.

Thus, in another non-limiting embodiment, used can be made of a so-called copper inlay technology for the power modules 200.

Thus, the invention described has the following advantages in particular:
It makes it possible to dismantle easily:
a power module which is not functioning, without a risk of damaging the electronic assembly or the rotary electrical machine;
the over-moulded housing part and the ground plate, without a risk of damaging the rotary electrical machine;
it avoids having to scrap the complete electrical machine, since there is no longer any need for electrical and laser welds during the integration of the over-moulded housing, part comprising the power modules with the electrical it
it reduces the volume occupied by the electronic assembly on the electrical machine:
by replacing the means for fitting of each power module which existed in the prior art by fitting means which are common to all the power modules, and are present on the over-moulded housing part;
by eliminating a power part according to the prior art, i.e. the power interconnector;
by replacing the plastic electronic housings of each power module by a single plastic electronic housing, i.e. the over-moulded housing part;
it reduces the total cost of the electronic assembly by:
using an inexpensive plastic for the over-moulded housing part;
eliminating the electrical and laser welds specific to each power module which existed in the prior art;
using a PCB board for the power modules;
it makes it possible to select the position of the phase outputs of the stator by means of overmoulding of the phase tracks in the over-moulded housing part. This therefore dispenses with the constraints of a given position of the phase outputs;
it makes it possible to adapt the electronic assembly easily for a three-phase, hexaphase, or another machine.

The invention claimed is:
1. Electronic assembly (10) for a rotary electrical machine for a motor vehicle, according to which said electronic assembly (10) comprises:
an over-moulded plastic housing part (100) comprising:

a plurality of receptacles (101) which are each designed to receive a power module (200);
a conductive power part (102) which is over-moulded in said over-moulded housing part (100), and comprises a plurality of phase and ground tracks (103*a*, 103*b*, 102);
fitting orifices (104', 104*a*, 104*b*) which are designed to receive fitting means (114) in order to fit each power module (200) on said over-moulded housing part (100);
a plurality of power modules (200) comprising:
a conductive support (2010) on which there are fitted:
a plurality of electronic power switches (2020);
signal components (2030);
said conductive support (2010) comprising:
a power connector (2011) which is designed to be connected to the conductive power part (102) of the over-moulded housing part (100);
at least two phase connectors (2012*a*, 2012*b*) which are designed to be connected to the phase tracks (103*a*, 103*b*) of said over-moulded housing part (100);
a lower ground plate (300) which is designed to receive said over-moulded housing part (100) and to be fitted on a dissipater (11) of the rotary electrical machine.

2. Electronic assembly (10) according to claim 1, wherein the plastic material of the over-moulded housing part (100) is polypropylene sulphide (PPS) or polybutadiene terephthalate (PBT).

3. Electronic assembly (10) according to claim 2, wherein the conductive power part (102) of said over-molded housing (100) part comprises a plurality of power connection tongues (102') arranged parallel to a plane of the over-moulded housing part (100), with a power connection tongue (102') being designed to cooperate with a power module (200).

4. Electronic assembly (10) according to claim 2, wherein the phase tracks (103*a*, 103*b*) of said over-moulded housing part (100) each comprise a first phase connection tongue (103*a*', 103*b*') which is designed to connect a power module (200), the first phase connection tongue (103*a*', 103*b*') being positioned parallel to a plane of the over-moulded housing part (100).

5. Electronic assembly (10) according to claim 2, wherein the phase tracks (10*a*, 103*b*) of said over-moulded housing part (100) each comprise a second phase connection tongue (103*a*", 103*b*") which is designed to connect a phase of a stator, the second phase connection tongue (103*a*", 103*b*") being positioned vertically relative to a plane of the over-moulded housing part (100).

6. Electronic assembly (10) according to claim 2, wherein the over-moulded housing part (100) comprises first and second fitting orifices (105-106), and the lower ground plate (300) comprises third and fourth fitting orifices (305-306), said first, second, third and fourth fitting orifices (105-106; 305-306) being designed to fit the said electronic assembly (10) on said dissipater (11) of the rotary electrical machine.

7. Electronic assembly (10) according to claim 1, wherein the conductive power part (102) of said over-moulded housing (100) part comprises a plurality of power connection tongues (102') arranged parallel to a plane of over-moulded housing part (100), with a power connection tongue (102') being designed to cooperate with a power module (200).

8. Electronic assembly (10) according to claim 7, wherein the phase tracks (103*a*, 103*b*) of said over-moulded housing part (100) each comprise a first phase connection tongue (103*a*', 103*b*') which is designed to connect a power module (200), the first phase connection tongue (103*a*', 103*b*') being positioned parallel to the plane of the over-moulded housing part (100).

9. Electronic assembly (10) according to claim 7, wherein the phase tracks (103*a*, 103*b*) of said over-moulded housing part (100) each comprise a second phase connection tongue (103*a*", 103*b*") which is designed to connect a phase of a stator, the second phase connection tongue (103*a*" 103*b*") being positioned vertically relative to the plane of the over-moulded housing part (100).

10. Electronic assembly (10) according to claim 7, wherein the over-moulded housing part (100) comprises first and second fitting orifices (105-106), and the lower ground plate (300) comprises third and fourth fitting orifices (305-306), said first, second, third and fourth fitting orifices (105-106; 305-306) being designed to fit the said electronic assembly (10) on said dissipater (11) of the rotary electrical machine.

11. Electronic assembly (10) according to claim 1, wherein the phase tracks (103*a*, 103*b*) of said over-moulded housing part (100) each comprise a first phase connection tongue (103*a*', 103*b*') which is designed to connect a power module (200), the first phase connection tongue (103*a*', 103*b*') being positioned parallel to a plane of the over-moulded housing part (100).

12. Electronic assembly (10) according to claim 11, wherein the phase tracks (103*a*, 103*b*) of said over-moulded housing part (100) each comprise a second phase connection tongue (103*a*", 103*b*") which is designed to connect a phase of a stator, the second phase connection tongue (103*a*", 103*b*") being positioned vertically relative to the plane of the over-moulded housing part (100).

13. Electronic assembly (10) according to claim 11, wherein the over-moulded housing part (100) comprises first and second fitting orifices (105-106), and the lower ground plate (300) comprises third and fourth fitting orifices (305-306), said first, second, third and fourth fitting orifices (105-106; 305-306) being designed to fit the said electronic assembly (10) on said dissipater (11) of the rotary electrical machine.

14. Electronic assembly (10) according to claim 1, wherein the phase tracks (103*a*, 103*b*) of said over-moulded housing part (100) each comprise a second phase connection tongue (103*a*", 103*b*") which is designed to connect a phase of a stator, the second phase connection tongue (103*a*", 103*b*") being positioned vertically relative to a plane of the over-moulded housing part (100).

15. Electronic assembly (10) according to claim 1, wherein the over-moulded housing part (100) comprises first and second fitting orifices (105-106), and the lower ground plate (300) comprises third and fourth fitting orifices (305-306), said first, second, third and fourth fitting orifices (105-106; 305-306) being designed to fit said electronic assembly (10) on said dissipater (11) of the rotary electrical machine.

16. Electronic assembly (10) according to claim 1, wherein the conductive support (2010) of a power module (200) is a printed circuit board (PCB).

17. Electronic assembly (10) according to claim 1, wherein the power (2011) and phase (2012*a*, 2012*b*) connectors of a power module (200) comprise respective fitting orifices (2014', 2014*a*, 2014*b*) which are designed to be positioned opposite said fitting orifices (104', 104*a*, 104*b*) in the over-moulded housing part (100), and to receive said fitting means (114).

18. Electronic assembly (10) according to claim 1, wherein the power (2011) and phase (2012a, 2012b) connectors of a power module are positioned parallel to a plane of said conductive support (2010).

19. Rotary electrical machine comprising:
   a rotor;
   a stator which is coupled to said rotor, and comprises a plurality of phases;
   an electronic assembly (10) according to claim 1, said over-moulded plastic housing part (100) of said electronic assembly (10) being designed to be connected to the phases of said stator;
   a rear bearing which supports said stator; and
   a dissipater (11) on which said electronic, assembly (10) is fitted.

20. Rotary electrical machine according to claim 19, according to which said rotary electrical machine is an alternator-starter.

\* \* \* \* \*